United States Patent [19]
Knowles et al.

[11] Patent Number: 5,945,672
[45] Date of Patent: Aug. 31, 1999

[54] GASEOUS BACKSCATTERED ELECTRON DETECTOR FOR AN ENVIRONMENTAL SCANNING ELECTRON MICROSCOPE

[75] Inventors: W. Ralph Knowles, North Andover; Thomas A. Hardt, Tewksbury; Peter D. Smith, Ipswich, all of Mass.

[73] Assignee: FEI Company, Hillsboro, Oreg.

[21] Appl. No.: 09/015,362

[22] Filed: Jan. 29, 1998

[51] Int. Cl.$^6$ ................................................. H01J 37/244
[52] U.S. Cl. ........................................ 250/310; 250/397
[58] Field of Search ................................. 250/310, 397

[56] References Cited

U.S. PATENT DOCUMENTS

| | | | |
|---|---|---|---|
| 4,308,457 | 12/1981 | Reimer | 250/310 |
| 4,596,928 | 6/1986 | Danilatos | 250/307 |
| 4,720,633 | 1/1988 | Nelson | 250/310 |
| 4,785,182 | 11/1988 | Mancuso et al. | 250/310 |
| 4,823,006 | 4/1989 | Danilatos | 250/310 |
| 4,857,743 | 8/1989 | Lambert | 250/505.1 |
| 4,880,976 | 11/1989 | Mancuso et al. | 250/310 |
| 4,897,545 | 1/1990 | Danilatos | 250/310 |
| 4,992,662 | 2/1991 | Danilatos | 250/310 |
| 5,250,808 | 10/1993 | Danilatos | 250/310 |
| 5,362,964 | 11/1994 | Knowles et al. | 250/310 |
| 5,412,211 | 5/1995 | Knowles | 250/310 |

Primary Examiner—Kiet T. Nguyen
Attorney, Agent, or Firm—Frommer Lawerence & Haug LLP

[57] ABSTRACT

An environmental scanning electron microscope is provided which is capable of only detecting backscattered electron signals emanating from the specimen with the detector assembly be positioned within the gaseous environment of the ESEM specimen chamber. This detector assembly includes a biased converter plate and a collection grid/collection plate/collector ring arrangement. The primary beam passes through the final pressure limiting aperture formed in the converter plate and then through a central aperture of the collection grid/plate/ring before striking the sample. The collection grid is held at ground potential and therefore does not collect secondary electron signals generated at the sample. The backscattered electrons are not collected by the collector grid/plate/ring and strike the converter plate creating converted backscattered electrons. The converted backscattered electrons are amplified in the gas by the electric field created between the converter plate and the collection grid. As a result, the collection grid/plate/ring will not collect secondary electron signals from the sample but will collect only an amplified converted backscattered electron signal. This dedicated gaseous backscattered electron detector can also be utilized to make a simple, low cost electron detector that can easily be switched between secondary electron detection, backscattered electron detection or both together.

45 Claims, 6 Drawing Sheets

GASEOUS BACKSCATTERED ELECTRON DETECTOR FOR AN ENVIRONMENTAL SCANNING ELECTRON MICROSCOPE

FIELD OF THE INVENTION

This invention relates to the field of environmental scanning electron microscopes ("ESEM"), and more particularly to a gaseous backscattered electron detector for an environmental scanning electron microscope which is intended to collect only a backscattered electron signal in the gaseous environment of the ESEM.

BACKGROUND OF THE INVENTION

As background, the advantages of an environmental scanning electron microscope over the standard scanning electron microscope ("SEM") lie in its ability to produce high-resolution electron images of moist or non-conductive specimens (e.g., biological materials, plastics, ceramics, fibers) which are extremely difficult to image in the usual vacuum environment of the SEM. The environmental scanning electron microscope allows the specimen to be maintained in its "natural" state, without subjecting it to the distortions caused by drying, freezing, or vacuum coating normally required for high-vacuum electron beam observation. Also, the relatively high gas pressure easily tolerated in the ESEM specimen chamber acts effectively to dissipate the surface charge that would normally build up on a non-conductive specimen, blocking high quality image acquisition. The environmental scanning electron microscope also permits direct, real-time observation of liquid transport, chemical reaction, solution, hydration, crystallization, and other processes occurring at relatively high vapor pressures, far above those that can be permitted in the normal SEM specimen chamber.

Typically, in an ESEM, the electron beam is emitted by an electron gun and passes through an electron optical column with an objective lens assembly having a final pressure limiting aperture at its lower end thereof. In the electron optical column, the electron beam passes through magnetic lenses which are used to focus the beam and direct the electron beam through the final pressure limiting aperture.

The beam is subsequently directed into a specimen chamber through the final pressure limiting aperture wherein it impinges upon a specimen supported upon the specimen stage. The specimen stage is positioned for supporting the specimen approximately 1 to 25 mm below the final pressure limiting aperture so as to allow the beam of electrons to interact with the specimen. The specimen chamber is disposed below the optical vacuum column and is capable of maintaining the sample enveloped in gas, typically water vapor, at a pressure of approximately between $10^{-2}$ and 50 Torr in registration with the final pressure limiting aperture such that a surface of the specimen may be exposed to the charged particle beam emitted from the electron gun and directed through the final pressure limiting aperture.

As stated in U.S. Pat. No. 4,992,662, the original concept of an environmental scanning electron microscope, as suggested in U.S. Pat. No. 4,596,928, was to maintain the specimen chamber in a gaseous environment such that the gaseous environment acted as a conditioning medium in order to maintain the specimen in a liquid or natural state. In addition, the utilization of the gaseous environment of the specimen chamber as a medium for amplification of the secondary electron signals is described in U.S. Pat. No. 4,785,182.

In the environmental SEM of U.S. Pat. No. 4,823,006, electron beam observation of unprepared, full-sized specimens at high vacuum pressure was made possible due to the combination of pressure control and signal detection means, housed entirely within the magnetic objective lens of the electron beam column. The environmental SEM design of U.S. Pat. No. 4,823,006 satisfied the simultaneous requirements for pressure control, electron beam focusing, and signal amplification, while providing no practical limitations on specimen handling or microscopic resolving power.

U.S. Pat. No. 4,880,976 describes the design and need for a gaseous secondary electron detector for an ESEM. Subsequent prior art describe improved secondary electron detectors and detectors that detect backscattered electrons, such as in U.S. Pat. No. 4,897,545.

However, it has been found desirable to provide a dedicated gaseous detector that is intended to collect only a backscattered electron signal. Moreover, it has been found desirable to provide a dual electron detector that can be switched between the secondary and backscattered electron detection modes.

Many different types of signals are generated in a conventional scanning electron microscope ("SEMI"), when the primary electron beam strikes the sample. The two most important electron signals are:

a) Secondary electrons ("SE") which produce the highest resolution images which show the topography of the surface of the sample; and b) Backscattered electrons ("BSE") which produce a lower resolution image but the signal is very sensitive to changes in the density of the sample material. The BSE images are also often used to show the distribution of different material components of the sample.

The conventional high vacuum SEM has an SE detector as standard and most users also purchase a separate BSE detector.

In addition, a fundamental aspect of an ESEM detector is the amplification of the electron signal in the gaseous environment of the specimen chamber. This is important because the electron signal levels used in an SEM are normally too small to be directly connected to an amplifier. The noise from the amplifier would be too high to make the SEM a practical instrument. In the conventional high vacuum SEM, the secondary electron signal is amplified (with negligible added noise) by a photomultiplier as part of a complex arrangement originally described by Everhart and Thornley. Hence, this type of detector is commonly called the Everhart-Thornley (E-T) detector. The E-T detector will not function in the ESEM because the high voltages used will discharge in the gas environment of the ESEM.

Hence, it is extremely desirable to provide a gaseous detector used in an ESEM which is designed to cause amplification of the signals to a high enough level to make the noise of the following electronics low.

Signal amplification in the gaseous environment of an ESEM is schematically represented in FIG. 1. As shown therein, an environmental scanning electron microscope provides a device for generating, amplifying and detecting secondary and backscattered electrons emanating from a surface of a sample being examined. A beam of electrons 10 is emitted through an electron optical column of an objective lens assembly 11 by an electron gun (not shown). The vacuum optical column includes a final limiting pressure aperture 14 at its lower end thereof. A beam 10 is directed into a specimen chamber 16 wherein it impinges upon a specimen 18 supported on a specimen stage 20. The specimen mount or stage 20 is located within the specimen chamber 16 and is positioned for supporting specimen 18 approximately 1 to 25 mm, and preferably 1 to 10 mm, below final pressure limiting aperture 14 so as to allow the beam of electrons to interact with the specimen. The specimen chamber is disposed below the optical vacuum column and is capable of maintaining the sample 18 enveloped in gas, preferably nitrogen or water vapor, at a pressure of approximately between $10^{-2}$ and 50 Torr in registration with the pressure limiting aperture such that a surface of the specimen may be exposed to the charged particle beam emitted from the electron gum and emitted through the pressure limiting aperture 14.

The ESEM detectors use an electric field in the gas to amplify an electron signal. When the primary beam 10 strikes the specimen 18, electrons are liberated. The electron field between the sample 18 and the detector electrode 22, held at a positive voltage, accelerates a signal electron, as at 24 until it has enough energy to ionize a gas molecule which also liberates another electron, as represented by reference numeral 27 in FIG. 1. The two electrons will be further accelerated to thereby generate more electrons, as at 28. This process can generate enough amplification for the electron current to be passed directly to a low noise amplifier 30. The amplification is typically in the range of 100 to 2,000. The amplification principle applies to any electron that is in the gas. FIG. 1 illustrates amplification of the low energy "secondary electrons" generated at the surface of the specimen.

Electrons can also be generated in the gas by backscattered electrons ("BSE"). These are high-energy electrons from the primary beam that are reflected from the sample. The BSEs have a high velocity and this high velocity reduces the chance that the BSE will strike a molecule in the gas between the sample and the detector. Hence, it has been found that only a small fraction of the BSE will generate a useful gas interaction. Accordingly, most of the signals collected by the detector electrode are generated by amplification of the secondary electrons.

U.S. Pat. No. 5,362,964 describes improvements in the design of a gaseous detector for an ESEM to maximize the SE collection while minimizing the collection of signals generated by other sources such as BSE. It has therefore been found desirable to provide a detector configuration for an ESEM that is designed to collect only signals generated by the BSE.

U.S. Pat. No. 4,897,545 to Danilatos describes a multi-electrode structure wherein the different electrodes will collect different proportions of SE and BSE information. Some electrodes collect a signal that is rich in SE, and some collect a signal that is rich in BSE. The '545 patent, however, does not relate to an electrode detector that collects only the BSE signal. Moreover, prior art exists which converts backscattered electrons (BSE) into secondary electrons (SE) and then collects the resulting SE signal—but only in high-vacuum SEMs. However, utilization of this conversion principle to generate a BSE signal detector in a gaseous environment does not exist.

OBJECTS OF THE INVENTION

Therefore, it is an object of the invention to provide an improved electron detector for an environmental scanning electron microscope which avoids the aforementioned deficiencies of the prior art.

It is also an object of this invention to provide an improved electron detector for an environmental scanning electron microscope which is in the form of a dedicated gaseous electron detector that is intended to collect only backscattered electron signals.

It is another object of this invention to provide a dual electron detector for an environmental scanning electron microscope that can be switched between the secondary and backscattered electron modes.

It is a further object of the present invention to provide an environmental scanning electron microscope which causes amplification of the electron signals to a high enough level to make the noise of the following electronics low.

It is yet another object of this invention to provide an environmental scanning electron microscope which uses the conversion principle to generate a BSE signal detector in a gaseous environment.

Various other objects, advantages and features of the present invention will become readily apparent from the ensuing detailed description and the novel features will be particularly pointed out in the appended claims.

SUMMARY OF THE INVENTION

This invention relates to a dedicated gaseous electron detector for an environmental scanning electron microscope that is intended to collect only backscattered electron signals. In addition, the present invention relates to a dual gaseous electron detector for an environmental scanning electron microscope that can be switched between the secondary and backscattered electron modes.

In an environmental scanning electron microscope, utilizing this invention, an electron detector is employed and electron beam is generated by an electron gun which passes through an electron optical column until the electron beam is focused and scanned across the diameter of the final pressure limiting aperture provided at the lower end of the electron optical column. The final pressure limiting aperture separates the relatively high vacuum of the electron optical column from the relatively low vacuum of the specimen chamber.

The specimen chamber is positioned below the electron optical column and is capable of maintaining the specimen enveloped in gas in registration with the final pressure limiting aperture such that a surface of the specimen may be exposed to the focused beam of electrons. A specimen stage is located within the specimen chamber and is positioned for supporting the specimen approximately 1 to 10 mm below the final pressure limiting aperture so as to allow the focused beam of electrons to interact with the specimen. In the specimen chamber, the specimen is maintained at a pressure between about $10^{-2}$ and 50 Torr, and preferably approximately 1 to 10 Torr.

In order to provide a dedicated gaseous detector that is intended to collect only backscattered electron signals, the present invention includes a detector assembly including a negatively biased converter plate upon which backscattered electrons emanating from the surface of the sample impinge to thereby generate secondary electrons at the surface thereof. These secondary electrons are referred to as "converted backscattered electrons." The converter plate also serves as the final pressure limiting aperture between the specimen chamber and the electron column.

Moreover, the detector assembly further includes a detector member which collects only the converted backscattered electrons generated by the converter plate. As will be discussed in more detail below, this detector member can be in the form of a collection grid, a collection plate or a collector ring.

In operation, the electron beam passes through a central opening in the converter plate and then through an aperture in the detector member before striking the specimen in the specimen chamber. The detector member is held at zero potential and accordingly does not collect the secondary electron signal generated at the specimen. The backscattered electrons will pass through an aperture arrangement in the detector member and strike the converter plate. As a result thereof, secondary electrons are generated at the surface of the converter plate (the "converted backscattered electrons"). The converted backscattered electrons are then amplified in the gas of the specimen chamber by the electric field created between the converter plate and the detector member, in the same way that the secondary electrons are amplified in the conventional gaseous secondary electron detectors. In order to obtain sufficient amplification of the converted backscattered electron signal in the gas, the spacing between the converter plate and the collector grid/plate/ ring is preferably in the range of approximately 1 to 5 mm. Therefore, the detector member configuration (i.e., the collection grid, the collection plate or the collector ring) does not collect a secondary electron signal from the sample but only collects an amplified converted backscattered electron signal.

The efficiency of the converter plate may be increased by making the converter plate from a material that converts the backscattered electrons to secondary electrons efficiently. Therefore, in the preferred embodiments, the converter plate is preferably made from gold or coated with magnesium or other materials known to generate a high yield of secondary electrons from the backscattered electrons.

The present invention also relates to a simple, low cost, electron detector configuration that can be easily switched between secondary electron detection, backscattered electron detection or both together. This dual electrode detector assembly utilizes the converter plate and one of the detector member configurations (i.e., collection grid, collection plate or collecting ring) discussed above. However, in the dual electron detector arrangement, predetermined voltages are applied to the converter plate and detector member to collect only secondary electron signals, backscattered electron signals, or both.

Therefore, if Vg is the voltage to obtain the required amplification of the electron signal, secondary electron signals are only detected by the dual detector if the converter plate is biased at the voltage of +Vg and the detector member is biased at a voltage of +Vg. With this dual detector arrangement, backscattered electron signals are only detected if the converter plate is biased at a voltage of −Vg and the detector member is biased at OV. In addition, both secondary and backscattered electron signals can be detected if the voltage applied to the detector member is +Vg and the voltage applied to the converter plate is between −Vg and +Vg. Accordingly, a dual electron detector arrangement has been designed that can be easily switched between secondary electron detection, backscattered electron detection or both together. In order to improve the dual detector assembly for shorter gas path, an insulating cone is sealed underneath the converter plate. The aperture of the insulating cone forms the pressure limiting aperture which is thereby much closer to the sample.

In addition, in order to show a "topographic" or backscattered electron image, the detector member is formed to be symmetrical about the electron beam axis. Therefore, the detector member is in the form of a split collecting device. The signals from the two segments of the split collecting device are added to give the normal material contrast and subtracted to obtain a topographic image.

BRIEF DESCRIPTION OF THE DRAWINGS

The following detailed description given by way of example, but not intended to limit the invention solely to the specific embodiments described, may best be understood in conjunction with the accompanying drawings in which.

DETAILED DESCRIPTION OF CERTAIN PREFERRED EMBODIMENTS

Figure 1:
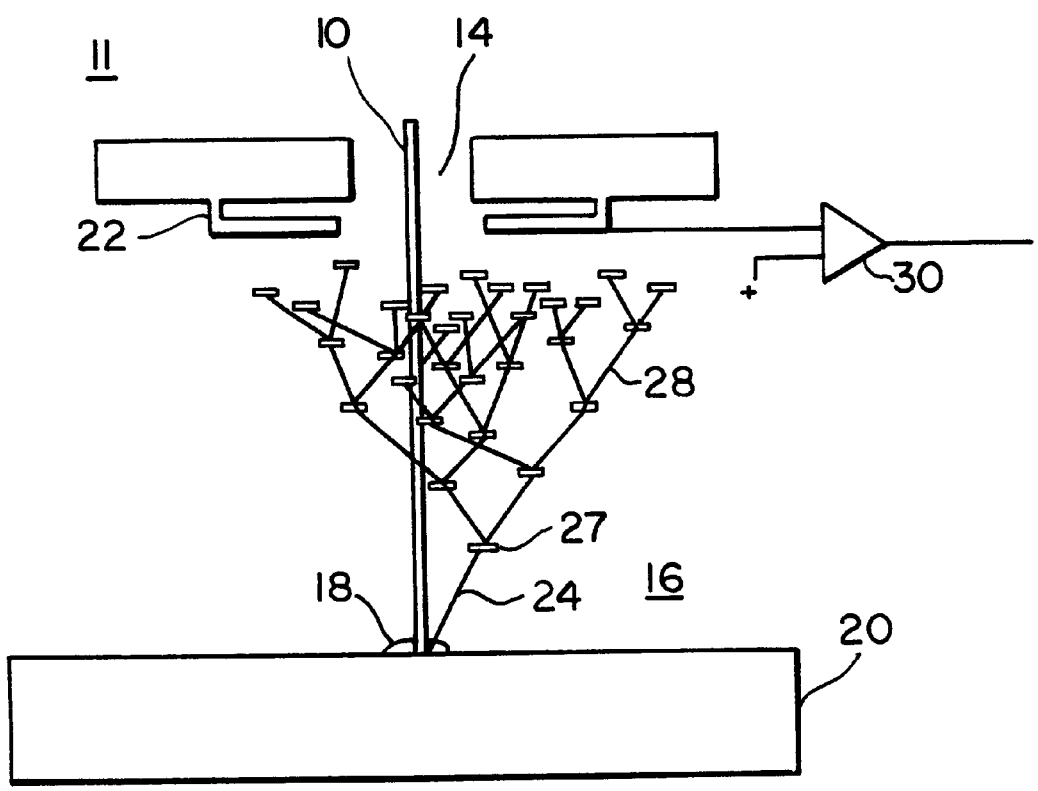
FIG. 1 is a schematic representation illustrating gaseous signal amplification in the specimen chamber of a conventional environmental scanning electron microscope.
Figure 2:
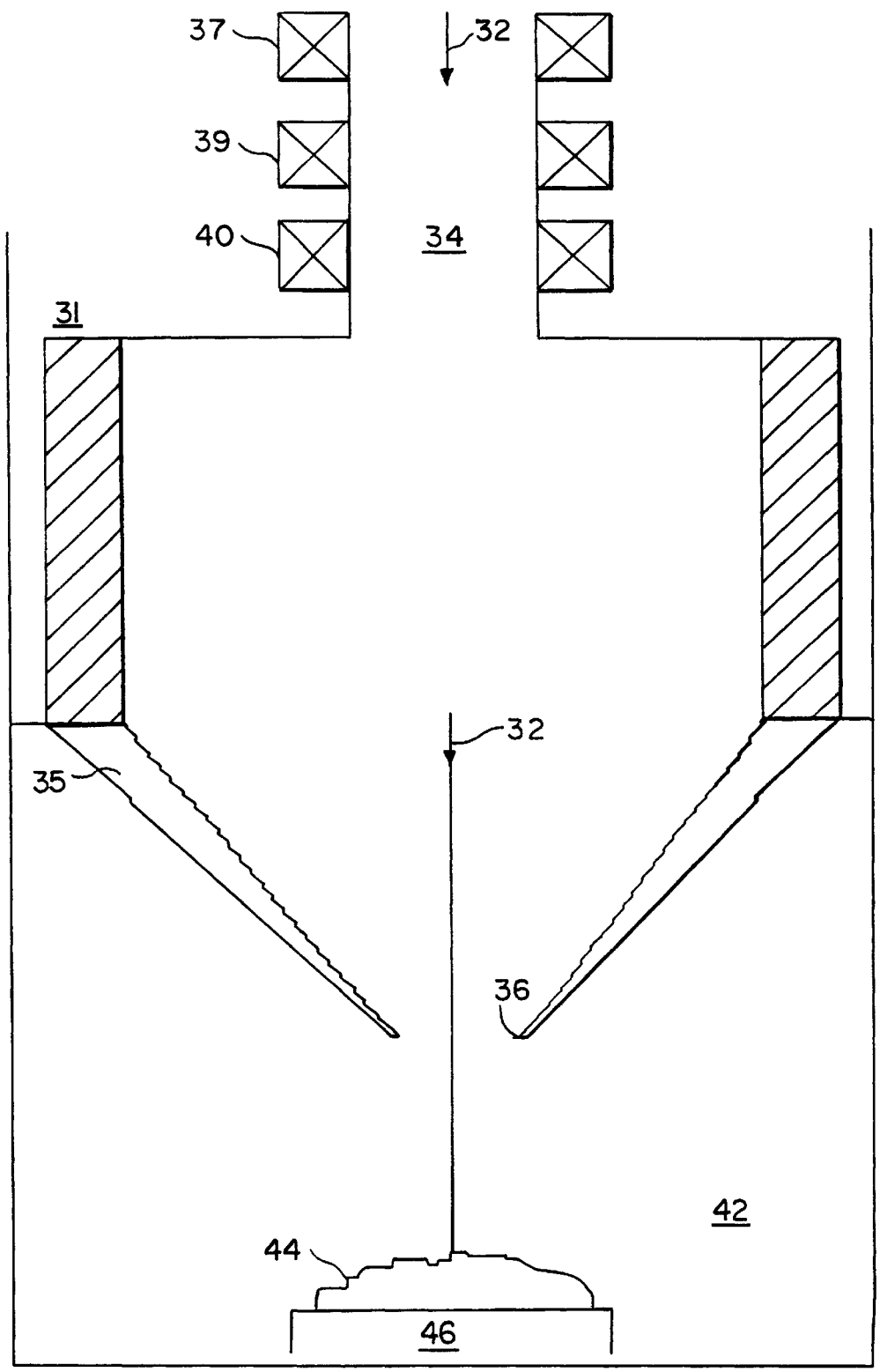
FIG. 2 is a schematic representative of the electron column and specimen chamber in a conventional ESEM.

Referring now to FIG. 2, the prior environmental scanning electron microscope of U.S. Pat. Nos. 5,362,964 and 5,412,211 is illustrated, the subject matter of which is incorporated by reference. In this environmental scanning electron microscope, a device for generating, amplifying and detecting secondary and backscattered electrons emanating from a surface of a sample being examined is provided. More specifically, a beam of electrons 32 is emitted through an electron optical column 34 and the objective lens assembly 31 by an electron gun (not shown). Within the electron optical column 34, the electron beam is subjected to a differential pumping system as is disclosed in U.S. Pat. Nos. 4,823,006 and 5,250,808 the subject matter of which are incorporated by reference. The electron optical column 34 includes a final pressure limiting aperture 36 at its lower end. The final pressure limiting aperture 36 is formed within the lower end of an aperture carrier 35. This aperture carrier 35 is disclosed in U.S. Pat. No. 4,823,006, the subject matter of which is incorporated by reference. The electron beam passes through magnetic lenses 37 and 39 which are used to control the intensity of the electron beam. Focusing means 40 located within the objective lens assembly 31 adjacent to the vacuum column is capable of directing the beam of electrons through the final pressure limiting aperture 36.

In the prior ESEM construction of FIG. 2, the beam is subsequentially directed into a specimen chamber 42 through final pressure limiting aperture 36 wherein it impinges upon a specimen 44 supported on a specimen stage 46. The specimen mount or stage 46 is located within the specimen chamber 42 and is positioned for supporting specimen 44 approximately 1 to 25 mm, and preferably 1 to 10 mm, below final pressure limiting aperture 36 so as to allow the beam of electrons to interact with the specimen. The specimen chamber 42 is disposed below the electron optical column 34 and is capable of maintaining the sample 44 enveloped in gas, preferably nitrogen or water vapor, at a pressure of approximately between $10^{-2}$ to 50 Torr in registration with the final pressure limiting aperture 36 such that a surface of the specimen may be exposed to the charged particle beam emitted from the electron gun and directed through the final pressure limiting aperture 36.

Figure 3A:
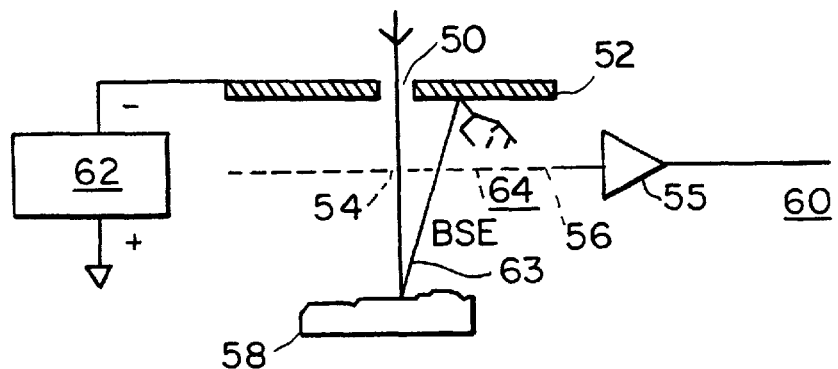
FIG. 3A is a schematic representation of a preferred embodiment for a dedicated gaseous backscattered electron detector for an environmental scanning electron microscope in accordance with the teachings of the present invention.

A preferred embodiment of a dedicated gaseous backscattered electron detector which collects only backscattered electron signals is illustrated in FIG. 3A. In this electron detector, the electron beam from the electron optical column passes through a central opening 50 in a convertor plate 52 and then through a central aperture 54 of a detector member 56 before striking the sample 58. The converter plate 52 also serves as the pressure limiting aperture between the specimen chamber and the electron column (corresponding with 36 in FIG. 2).

In the embodiment shown in FIG. 3A, the detector member 56 is in the form of a collection grid having a wire mesh structure. The converter plate 52 and the collection grid 56 are supported in the gaseous environment of the ESEM specimen chamber 60.

The collection grid 56 is held at ground potential and accordingly does not collect the secondary electron signal generated at the specimen. The converter plate 52 is held at a negative voltage by a power supply 62.

Figure 3B:
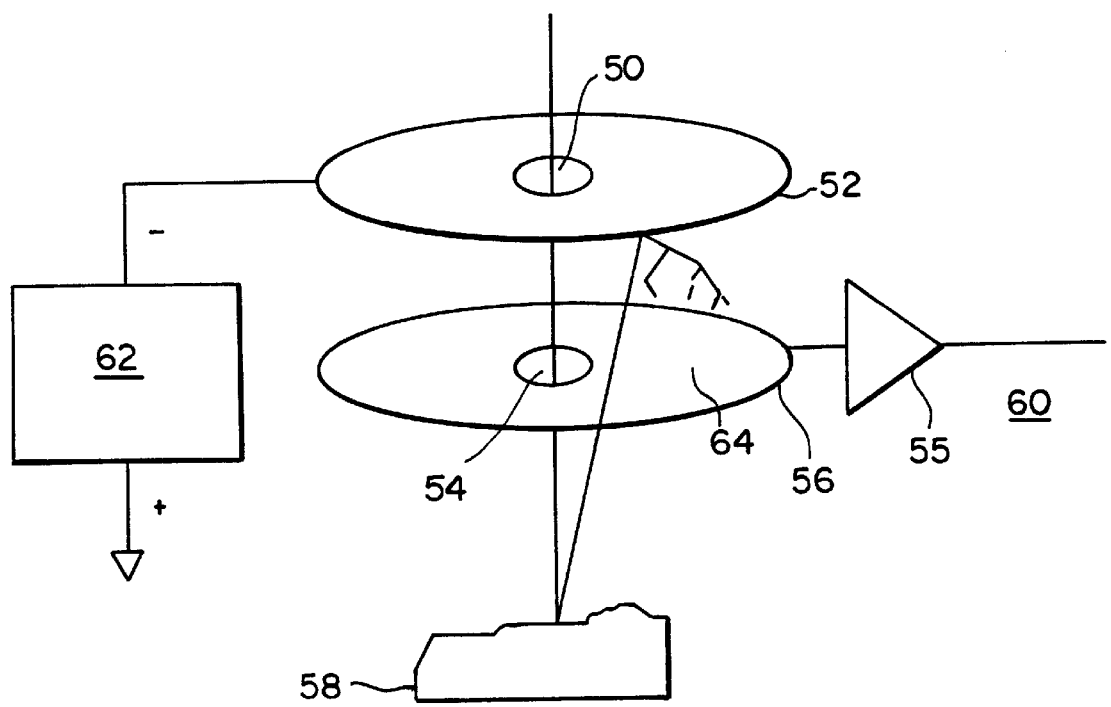
FIG. 3B is a corresponding diagram to the schematic representation of FIG. 3A specifically illustrating the converter plate and the collection grid in isometric view.

As schematically represented in FIGS. 3A and 3B, the backscattered electrons (or BSE) 63 will pass through perforations 64 provided in the wire mesh structure of the collection grid 56 and strike the converter plate 52. This will generate secondary electrons at the surface of the converter plate 52. For sake of simplification, these secondary electrons generated at the surface of the converter plate 52 are referred to herein as "converted backscattered electrons". These converted backscattered electrons are amplified in the gas of the specimen chamber by the electric field created between the converter plate 52 and the collection grid 56 in the same way that secondary electrons emanating from the surface of the sample are amplified in the conventional gaseous secondary electron detectors.

Moreover, it is known that signal amplification in the gaseous environment of the ESEM specimen chamber requires a distance of approximately 1 to 5 mm to obtain a sufficient amplification of the electron signal. Hence, the converter plate 52 and the detector member, such as the collection grid 56, should be spaced at a distance of approximately 1 to 5 mm as well.

These converted backscattered electron signals are then collected by the collection grid 56 for further amplification through signal amplifier 55. Hence, an electron detector configuration is designed that does not collect any secondary electron signals but instead collects only an amplified converted BSE signal.

Figure 4:
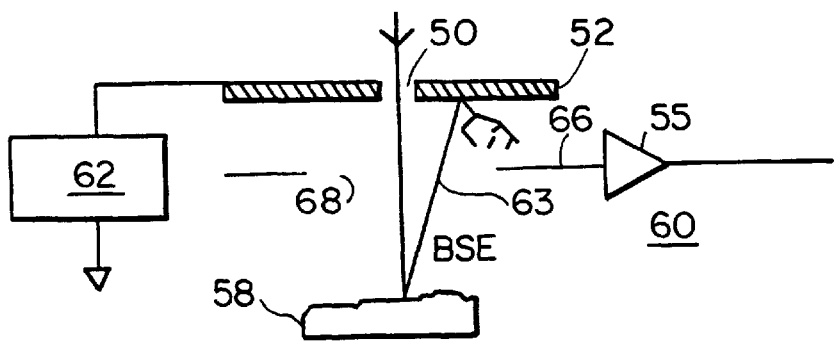
FIG. 4 is a schematic representation illustrating another preferred embodiment of a dedicated gaseous backscattered electron detector for an environmental scanning electron microscope in accordance with the teachings of the present invention.

In the alternative embodiment of FIG. 4, the collection grid 56 is replaced by a collection plate 66. The collection plate 66 has a relatively large central aperture 68 to allow the BSE to pass therethrough, but is small enough that the converted BSE are adequately collected.

Figure 5:
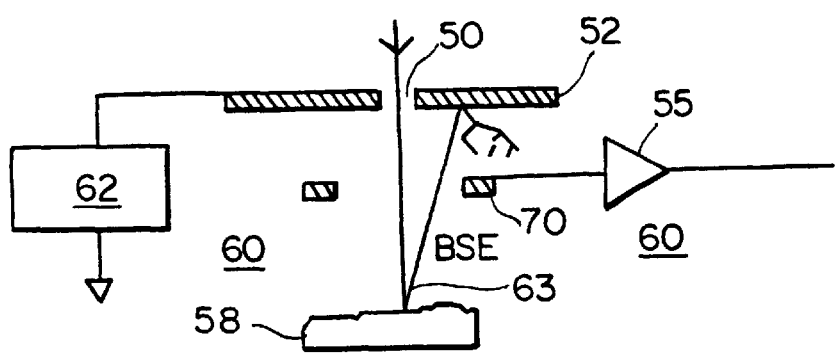
FIG. 5 is a schematic representation of yet another preferred embodiment of a dedicated gaseous backscattered electron detector for an environmental scanning electron microscope in accordance with the teachings of the present invention.

FIG. 5 illustrates an alternative dedicated gaseous electron detector wherein a collector ring 70 is utilized to collect the amplified converted BSE signals. The collector ring 70 is preferably circular and the area thereof is small enough to allow most of the backscattered electron to pass unobstructed to the converter plate 52.

In many applications of the ESEM, it is possible that the signal electrodes (grids, plates, or rings) may become dirty with material generated by sample experimentation. It is therefore desirable that the signal electrodes can be cleaned without damage. Therefore, the collection plate of FIG. 3A and the collector ring of FIG. 4 are advantageous in this respect as it is difficult to clean the collection grid and maintain the open structure for high transmission of the BSE.

The signal collected by the collection electrode can be increased by making the converter plate 52 from a material that converts the backscattered electrons to secondary electrons efficiently. Gold is known to generate a high yield of SE from the BSE, and certain other materials, such as magnesium oxide, may be used.

Furthermore, the predominant use for backscattered electron detector imaging is to produce images that show material contrast with minimal topographic information. In this case, the detector needs to be symmetrical about the primary beam axis as shown above.

Figure 6:
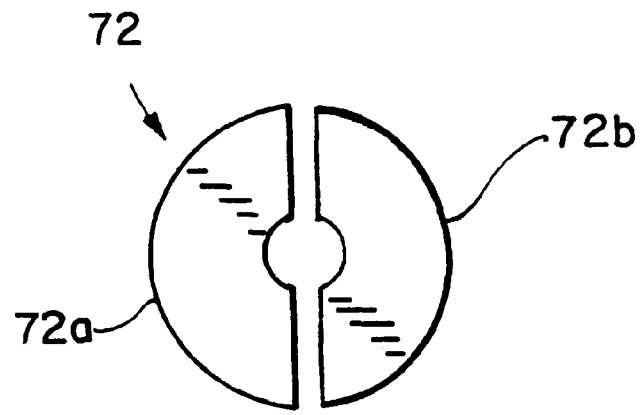
FIG. 6 is a top elevational view of a preferred embodiment of a multiple segmented electron detector for use in conjunction with the dedicated gaseous backscattered electron detectors of FIGS. 3 through 5.

However, there is a need for the ability to show a "topographic" BSE image which is generally done by using a split collecting device 72, such as shown in FIG. 6, for collecting the electron signal. The split collecting device 72 includes two segments 72a and 72b—the signals of which are added to obtain normal material contrast and subtracted to obtain a topographic image.

The dedicated gaseous backscattered electron detector configuration of FIGS. 3A, 3B, 4 and 5 can also be used to create a simple low cost detector that can easily be switched between secondary electron detection, backscattered electron detection or both together. This dual detector for collecting secondary electron and backscattered electron signals is illustrated in FIG. 7.

Figure 7:
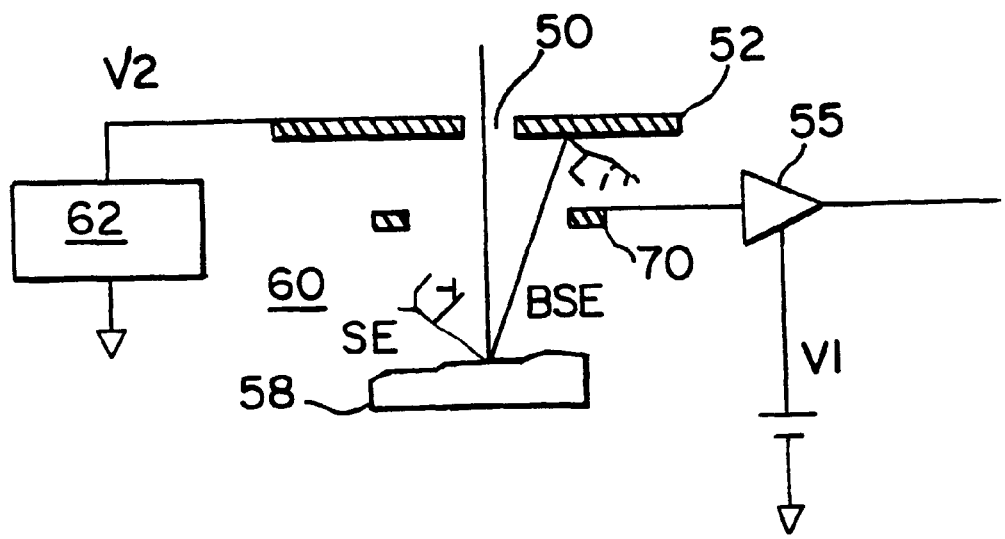
FIG. 7 is a schematic representation of a preferred embodiment of a dual electron detector for an ESEM in accordance with the teachings of the present invention which collects both secondary electron and backscattered electron signals.

In comparison to the detector configurations illustrated in FIGS. 3A, 3B, 4 and 5, the collector plate/grid/grid is biased at a voltage of V1 in FIG. 7. The converter plate 52 is biased at a voltage of V2. If Vg is the voltage needed to obtain the required amplification of the electron signal, the following chart sets forth the electron signals which will be collected on the collection grid/collection plate/collector ring as follows:

| Signal collected on collection plate/grid/ring | V1 | V2 |
| --- | --- | --- |
| Secondary electrons | +Vg | +Vg |
| Backscattered electrons | 0V | −Vg |
| Both secondary electrons and backscattered electrons | +Vg | −Vg to +Vg |

In order to obtain the required amplification of the electron signal, Vg is typically in the range of approximately 100 to 500 volts.

Figure 8:
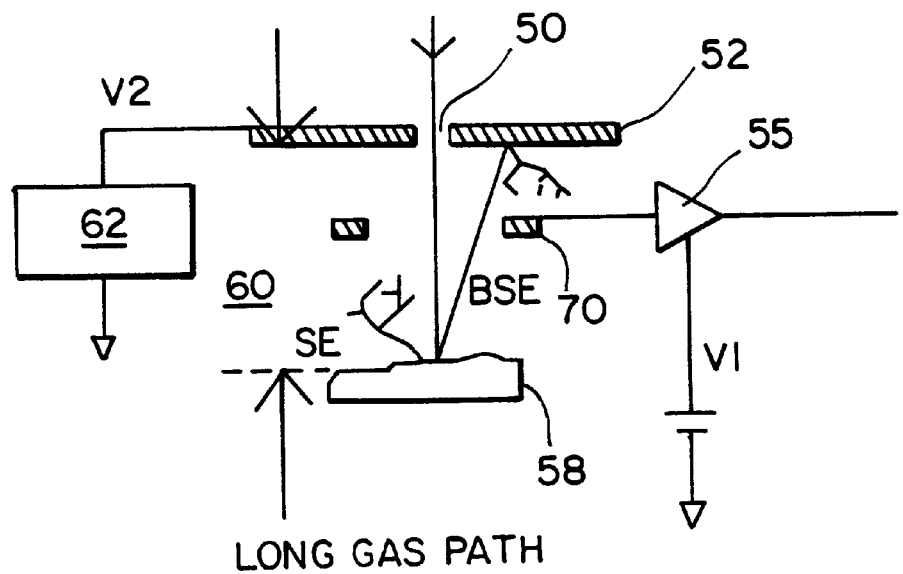
FIG. 8 is a schematic representation of the dual electron detector assembly of FIG. 7 showing a relatively long gas path for the primary beam.

FIG. 8 illustrates the dual electron detector with a relatively long gas path for the primary beam. The specimen 58 needs to be placed approximately 1 to 5 mm below the collector ring 70 in order to generate adequate amplification of the secondary electron signals. Also, the collector ring 70 is positioned approximately 1 to 5 mm from the converter plate 52 to obtain sufficient amplification of the backscattered electron signal. Hence, in the dual detector configuration of FIG. 8, the primary electron beam has to travel through approximately 2–10 mm of gas. This may generate significant beam loss and lead to reduced performance.

Figure 9:
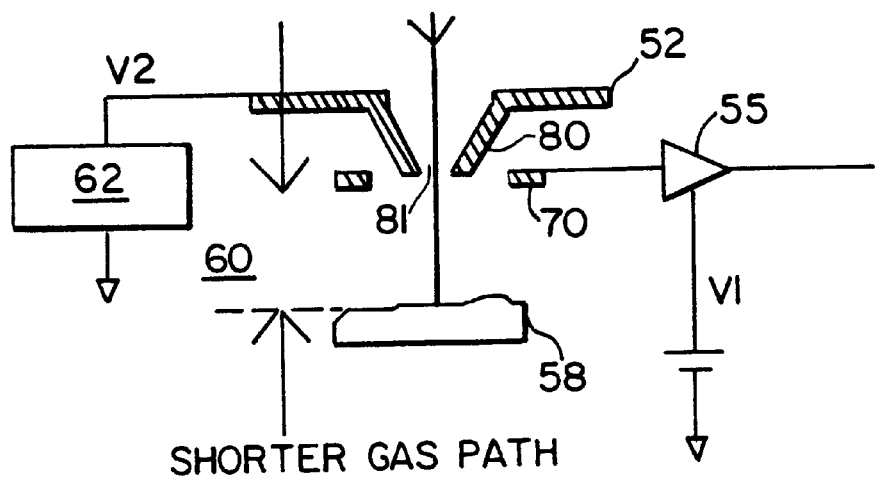
FIG. 9 is a schematic representation of an improvement in the dual electron detector of FIG. 7 which specifically shows adding an insulating cone to the dual electron detector to provide for a shorter gas path for the electron beam.

Accordingly, an improved dual electron detector has been designed which shortens the gas path for the primary beam. This improved dual detector configuration is illustrated in FIG. 9. As is shown therein, an insulated cone 80 is sealed underneath the converter plate 52. The lower opening 81 of the insulated cone 80 forms the pressure limiting aperture which is much closer to the sample. The cone 80 must be electrically insulating because of the high voltages that may be present between the detector ring 70 and the converter plate 52.

The present invention also addresses the effect of the gas path on the primary beam. To this end, U.S. Pat. No. 5,250,808 previously describes integrating the gaseous detector with a differential pumping system to allow a high vacuum in the electron column even with high gas pressure in the specimen chamber.

In prior gaseous secondary electron detectors used in environmental scanning electron microscopes, the primary beam passes through the same high pressure gas zone that is used for amplification. This causes some loss of the primary beam due to interaction between the primary beam and the gas. With a 1 to 5 mm spacing, the loss is usually acceptable.

However, in utilizing the dedicated gaseous backscattered electron detectors of the present invention, the primary beam has to travel through the gas between the converter plate and the collection plate/grid/ring. The sample can advantageously be placed close to the collector grid for the :backscattered electron detection since the collector ring is at zero voltage. Therefore, in order to minimize the gas path for the primary beam in the gaseous backscattered electron detector of the present invention, the sample can be placed close to the collection grid and the required gaseous amplification can still be obtained.

Accordingly, in accordance with the general objects of the present invention, an improved electron detector for an environmental scanning electron microscope has been provided which is in the form of a dedicated gaseous detector that is intended to collect only backscattered electron signals. This dedicated gaseous detector also causes amplification of the signals to a high enough level to make the noise of the following electronic detectors low. Moreover, the present invention also allows for a simple, low cost, electron detector that can easily be switched between secondary electron detection, backscattered electron detection or both together.

Although the invention has been particularly shown and described with reference to certain preferred embodiments, it will be readily appreciated by those of ordinary skill in the art that various changes and modifications may be made therein without departing from the spirit and scope of the invention. It is intended that the appended claims be interpreted as including the foregoing as well as various other such changes and modifications.

What is claimed is:

1. An environmental scanning electron microscope comprising:

(a) means for generating and directing an electron beam from an electron column towards a surface of a specimen enveloped in a gaseous environment of a specimen chamber; and (b) detector means for only detecting backscattered signals emanating from the specimen with said detector means positioned in the gaseous environment of the specimen chamber, said detector means including a negatively biased converter plate upon which backscattered electrons emanating from the surface of the specimen impinge upon to thereby generate secondary electrons at the surface thereof forming converted backscattered electrons.

2. The environmental scanning electron microscope of claim 1 wherein said converter plate includes a central opening through which said electron beam passes.

3. The environmental scanning electron microscope of claim 2 wherein said central opening of said converter plate defines a final pressure limiting aperture between the electron column and the specimen chamber.

4. The environmental scanning electron microscope of claim 1 wherein said detector means further includes means for collecting only the converted backscattered electrons generated by said converter plate.

5. The environmental scanning electron microscope of claim 4 wherein said converted backscattered electron collecting means is in the form of a collection grid.

6. The environmental scanning electron microscope of claim 5 wherein said collection grid is biased at ground so that said grid does not collect the secondary electron generated at the specimen.

7. The environmental scanning electron microscope of claim 5 wherein said collection grid includes a central aperture through which said electron beam passes.

8. The environmental scanning electron microscope of claim 5 wherein said collection grid is in the form of an open mesh so that the backscattered electrons emanating at the surface of the specimen will pass therethrough.

9. The environmental scanning electron microscope of claim 5 wherein said collection grid is connected to a signal amplifier.

10. The environmental scanning electron microscope of claim 4 wherein said converted backscattered electron collection means is in the form of a collection plate.

11. The environmental scanning electron microscope of claim 10 wherein said collection plate includes a central aperture sufficiently large to permit backscattered electrons emanating from the surface of the specimen to pass therethrough but of a predetermined size so that the converted backscattered electrons are collected on a annular plate portion thereof.

12. The environmental scanning electron microscope of claim 10 wherein said collection plate is biased at ground so that said plate does not collect the secondary electrons generated at the specimen.

13. The environmental scanning electron microscope of claim 10 wherein said collection plate is connected to a signal amplifier.

14. The environmental scanning electron microscope of claim 4 wherein said converted backscattered electron collecting means is in the form of a collection ring.

15. The environmental scanning electron microscope of claim 14 wherein said collection ring includes a central aperture sized to permit backscattered electrons emanating from the surface of the specimen to pass therethrough unobstructed to said converter plate.

16. The environmental scanning electron microscope of claim 14 wherein said collection ring is connected to a signal amplifier.

17. The environmental scanning electron microscope of claim 14 wherein said collection ring is biased at ground so that said ring does not collect the secondary electrons generated at the specimen.

18. The environmental scanning electron microscope of claim 4 wherein said converted backscattered electron collecting means is a split collecting device having a pair of collecting segments symmetrical about the electron beam axis.

19. The environmental electron scanning microscope of claim 4 wherein said converter plate and said converted backscattered electron collecting means are spaced from each other in the range of approximately 1 to 5 mm.

20. The environmental scanning electron microscope of claim 4 and further including an insulating cone sealed to and extending from a bottom surface of said converter plate and having a final pressure limiting aperture at its lower end so as to provide a shortened electron beam path in the specimen chamber.

21. The environmental scanning electron microscope of claim 1 wherein said converter plate can be made with a material which increases the efficiency of conversion of backscattered electrons to secondary electrons and is selected from the group consisting of gold and magnesium oxide.

22. The environmental scanning electron microscope of claim 1 wherein said converter plate is coated with a material which increases the efficiency of conversion of backscattered electrons to secondary electrons and is selected from the group including gold and magnesium oxide.

23. An environmental scanning electron microscope comprising:
   (a) means for generating and directing an electron beam from an electron column towards a surface of a specimen enveloped in a gaseous environment of a specimen chamber; and
   (b) dual detector means for detecting both secondary electron signals and backscattered electron signals emanating from the specimen and including means for switching between the detection of secondary electron signals and backscattered electron signals wherein said detector means being positioned in the gaseous environment of the specimen.

24. The environmental scanning electron microscope of claim 23 wherein said dual detector means includes a converter plate biased at a voltage V2 upon which backscattered electrons emanating from the surface of the specimen impinge upon to thereby create converted backscattered electrons and further includes means for collecting secondary and backscattered electron signals biased at a voltage V1 which is positioned below said converter plate in said specimen chamber and wherein Vg is the voltage to obtain the required amplification of the electron signals in the gaseous environment of the specimen chamber so that secondary electron signals are only detected by said dual detector means if V1 is equal to +Vg and V2 is equal to +Vg, backscattered electron signals are only detected if V1 is OV and V2 is −Vg, and both secondary and backscattered electron signals are detected if V1 is +Vg and V2 is between −Vg and +Vg.

25. The environmental scanning electron microscope of claim 24 wherein Vg is in the range of approximately 100 to 500 volts.

26. An environmental scanning electron microscope comprising:
   (a) a vacuum column having a pressure limiting aperture at a lower end thereof;
   (b) a charged particle beam source located within the vacuum column which emits an electron beam;
   (c) focusing means locating within the vacuum column which directs the electron beam emitted by the charged particle beam source through said pressure limiting aperture;
   (d) a specimen chamber, positioned below said pressure limiting aperture, which maintains the specimen enveloped in gas at a pressure of approximately 1 to 50 Torr in registration with the pressure limiting aperture such that a surface of the specimen may be exposed to an electron beam emitted from the charged particle beam source and directed through said pressure limiting aperture; and
   (e) detector means for only detecting backscattered electrons emanating from the specimen with said detector means positioned in the gaseous environment of the specimen chamber, said detector means including a biased converter plate upon which backscattered electrons emanating from the surface of the specimen impinge upon to thereby generate secondary electrons at the surface thereof forming converted backscattered electrons and further including means for collecting only the converted backscattered electrons generated by said converter plate.

27. The environmental scanning electron microscope of claim 26 wherein said converter plate is negatively biased.

28. The environmental scanning electron microscope of claim 26 wherein said converter plate includes a central opening through which said electron beam passes.

29. The environmental scanning electron microscope of claim 28 wherein said central opening of said converter plate defines a final pressure limiting aperture between the vacuum column and the specimen chamber.

30. The environmental scanning electron microscope of claim 26 wherein said converted backscattered electron collecting means is biased at ground so as not to collect the secondary electrons generated at the specimen.

31. The environmental scanning electron microscope of claims 26 wherein said converted backscattered electron collecting means includes a central aperture through which said electron beam passes.

32. The environmental scanning electron microscope of claim 26 wherein said converted backscattered electron collecting means is connected to a signal amplifier.

33. The environmental scanning electron microscope of claim 26 wherein said converted backscattered electron collecting means is in the form of a collection grid.

34. The environmental scanning electron microscope of claim 33 wherein said collection grid is in the form of an open mesh so that the backscattered electrons emanating at the surface of the specimen will pass therethrough.

35. The environmental scanning electron microscope of claim 26 wherein said converted backscattered electron collecting means is in the form of a collection plate.

36. The environmental scanning electron microscope of claim 35 wherein said collection plate includes a central aperture sufficiently large to permit backscattered electrons emanating from the surface of the specimen to pass therethrough but is of a predetermined size so that the converted backscattered electrons are collected on a annular plate portion thereof.

37. The environmental scanning electron microscope of claim 26 wherein said converted backscattered electron collecting means is in the form of a collector ring.

38. The environmental scanning electron microscope of claim 37 wherein said collector ring includes a central aperture sized to permit backscattered electrons emanating from the surface of the specimen to pass therethrough unobstructed to said converter plate.

39. The environmental scanning electron microscope of claim 26 wherein said converter plate can be made with a material which increases the efficiency of conversion of backscattered electrons to secondary electrons and is selected from the group consisting of gold and magnesium oxide.

40. The environmental scanning electron microscope of claim 26 wherein said converter plate is coated with a material which increases the efficiency of conversion of backscattered electrons to secondary electrons and is selected from the group consisting of gold and magnesium oxide.

41. The environmental scanning electron microscope of claim 26 wherein said converted backscattered electron collecting means is in the form of a split collecting device having two collecting segments symmetrical about a directing axis of the electron beam.

42. The environmental scanning electron microscope of claim 26 wherein said converter plate and said converted backscattered electron collecting means are spaced from each other in the range of approximately 1 to 5 mm.

43. The environmental scanning electron microscope of claim 26 and further including an insulating cone sealed to and extending from a bottom surface of said converter plate and having a final pressure limiting aperture at its lower end so that a traveling path of the electron beam in the specimen chamber is shortened.

44. An environmental scanning electron microscope comprising:
   (a) a vacuum column having a pressure limiting aperture at a lower end thereof;
   (b) a charged particle beam source located within the vacuum column which emits an electron beam;
   (c) focusing means locating within the vacuum column which directs the electron beam emitted by the charged particle beam source through said pressure limiting aperture;
   (d) a specimen chamber, positioned below said pressure limiting aperture, which maintains a specimen enveloped in gas at a pressure of approximately 1 to 50 Torr in registration with the pressure limiting aperture such that a surface of the specimen may be exposed to the electron beam emitted from the charged particle beam source and directed through said pressure limiting aperture; and
   (e) dual detector means for detecting both secondary electron signals and backscattered electron signals emanating from the specimen and including means for switching between the detection of secondary electrons and backscattered electrons wherein said detector means being positioned in the gaseous environment of the specimen chamber.

45. The environmental scanning electron microscope of claim 44 wherein said dual detector means includes a converter plate biased at a voltage V2 upon which backscattered electrons emanating from the surface of the sample impinge upon to thereby create converted backscattered electrons and means for collecting secondary and backscattered electron signals biased at a voltage V1 which is positioned below said converter plate in said specimen chamber and wherein Vg is the voltage to obtain the required amplification of the secondary and backscattered electron signals in the gaseous environment of the specimen chamber so that secondary electron signals are only detected by said dual detector means if V1 is equal to +Vg and V2 is equal to +Vg, backscattered electron signals are only detected if V1 is 0V and V2 is −Vg, and both secondary and backscattered electron signals are detected if V1+Vg and V2 is between −Vg and +Vg.

* * * * *